(12) United States Patent
Park et al.

(10) Patent No.: US 6,989,231 B2
(45) Date of Patent: Jan. 24, 2006

(54) METHOD OF FORMING FINE PATTERNS USING SILICON OXIDE LAYER

(75) Inventors: Jae-eun Park, Yongin (KR); Kang-soo Chu, Suwon (KR); Joo-won Lee, Suwon (KR); Jong-ho Yang, Seoul (KR)

(73) Assignee: Samsung Electronics, Co., Ltd., (KR)

( * ) Notice: Subject to any disclaimer, the term of this patent is extended or adjusted under 35 U.S.C. 154(b) by 230 days.

(21) Appl. No.: 10/452,413

(22) Filed: Jun. 3, 2003

(65) Prior Publication Data

US 2004/0029052 A1    Feb. 12, 2004

(30) Foreign Application Priority Data

Aug. 9, 2002    (KR) ...................... 10-2002-0047233

(51) Int. Cl.
*G03C 5/00*    (2006.01)
(52) U.S. Cl. ...................... 430/313; 430/314; 430/317; 430/316
(58) Field of Classification Search ................ 430/314, 430/313, 317, 316
See application file for complete search history.

(56) References Cited

U.S. PATENT DOCUMENTS 6,004,853 A  * 12/1999 Yang et al. .................. 438/305

FOREIGN PATENT DOCUMENTS

| KR | 97-24184 | 5/1997 |
| KR | 98-54746 | 9/1998 |

* cited by examiner

*Primary Examiner*—John A. McPherson
*Assistant Examiner*—Daborah Chacko-Davis
(74) *Attorney, Agent, or Firm*—Mills and Onello, LLP

(57) ABSTRACT

Provided is a method of forming a fine pattern, in which a silicon oxide layer is formed on a photoresist pattern and dry etching is performed on the resultant structure. According to the method, a photoresist pattern is formed on a material layer on which a fine pattern is to be formed, a silicon oxide layer is conformally deposited on the photoresist pattern without damaging the photoresist pattern, and dry etching is performed on a lower layer. During the dry etching, spacers are formed along the sidewalls of the photoresist pattern, and then, a polymer layer is formed on the photoresist pattern. Accordingly, it is possible to prevent the thinning of the photoresist pattern so that a desired pattern can be obtained, and further, to prevent striation or wiggling from occurring on the patterned material layer.

17 Claims, 5 Drawing Sheets

METHOD OF FORMING FINE PATTERNS USING SILICON OXIDE LAYER

BACKGROUND OF THE INVENTION

This application claims the priority of Korean Patent Application No. 2002-47233, filed 9 Aug. 2002 in the Korean Intellectual Property Office (KIPO), which is incorporated herein in its entirety by reference.

1. Field of the Invention

The present invention relates to a method of forming fine patterns for use in a semiconductor device, and more particularly, to a method of forming fine patterns by forming a thin silicon oxide layer on photoresist patterns before dry etching.

2. Description of the Related Art

The rapid increase in the integration of semiconductor devices results in a remarkable reduction in the size of a unit cell. A reduction in the size of a unit cell causes a reduction in the size of each of the devices formed on the unit cell. That is, the size of a transistor or a capacitor, the width of an interconnect wiring, distance between interconnect wirings, the size of a contact that electrically connects upper and lower devices are reduced.

To fabricate such a fine device, a plurality of processes are required. In particular, a photolithography technique is indispensable to precisely make fine patterns.

To perform the photolithography process, a photoresist pattern of a small critical dimension (CD) is required because of the smaller size of patterns used in fine devices. Much attention must be paid so as not to do damage to-a fine photoresist pattern during an etching process, especially during dry etching.

For instance, a photoresist pattern may be thinned or deformed. The thinning of a photoresist pattern deteriorates the pattern profile of a layer to be etched, and the deformation thereof causes problems, such as striation and/or wiggling, in a lower layer to be etched.

To solve these problems, using a multi-layered resist (MLR) or applying a polymer on a photoresist has been suggested. However, these suggestions become unfeasible as the CD of a photoresist pattern becomes smaller. Alternatively, a silicon chemical amplification of resist line (Si-CARL) process is used to solve these problems. However, this process is also not recommended because it causes excessive generation of impurities between fine patterns.

SUMMARY OF THE INVENTION

The present invention provides a method of effectively forming a fine pattern having an even pattern profile for use in a semiconductor device, in which damage to a fine photoresist pattern, such as thinning of the pattern or the occurrence of striation and/or wiggling, are prevented.

According to the method of the present invention, a silicon oxide layer is thinly formed over a photoresist pattern, and dry etching is performed on the resultant structure.

According to one aspect of the present invention, there is provided a method of forming a fine pattern by etching a material layer formed on a semiconductor substrate, the method including forming a photoresist layer on the material layer; forming a photoresist pattern by performing exposure and developing processes on the photoresist layer; forming a first silicon oxide layer conformally on the material layer and the photoresist pattern without damaging the photoresist pattern; and forming a material layer pattern by dry etching the material layer.

Preferably, the first silicon oxide layer is formed at a temperature between room temperature and 400° C. in order not to damage the photoresist pattern, and the first silicon oxide layer is formed to a thickness of less than 200 Å. Further, the first silicon oxide layer may be formed using atomic layer deposition (ALD).

The material layer pattern may be a line-type pattern. In this case, the material layer pattern is one of a bit line pattern and a word line pattern. Also, the material layer may be a stacked structure including a second silicon oxide layer, a polysilicon layer, a metal silicide layer, and an anti-reflection layer.

Alternatively, the material layer pattern may be a hole-type pattern.

According to another aspect of the present invention, there is provided a method of forming a fine pattern by etching a material layer formed on a semiconductor substrate, the method including forming a photoresist layer on the material layer; forming a photoresist pattern by performing exposure and developing processes on the photoresist layer; forming a silicon oxide layer conformally on the material layer and the photoresist pattern without damaging the photoresist pattern; performing a first dry etching on the material layer under a process condition in which the etch rate of the first silicon oxide layer is higher than that of the photoresist pattern; and forming a material layer pattern by performing a second dry etching on the material layer under a process condition in which the etch rate of the first silicon oxide layer is lower than that of the photoresist pattern.

Preferably, the first silicon oxide layer is formed at a temperature between room temperature and 400° C. in order not to damage the photoresist pattern, and formed to a thickness of less than 200 Å. Also, the first silicon oxide layer may be formed using ALD.

When performing the first dry etching, spacers may be formed along the sidewalls of the photoresist patterns in order to make the etch rate of the first silicon oxide layer higher than that of the photoresist patterns. In contrast, a polymer layer containing $C_xF_y$ may be formed on the photoresist pattern in order to make the etch rate of the photoresist pattern higher than that of the first silicon oxide layer.

The obtained material layer pattern may be a line-type pattern. In this case, the material layer pattern may be a conducting line pattern such as a bit line pattern or a word line pattern. In this case, the material layer may be a stacked structure including a second silicon oxide layer, a polysilicon layer, a metal silicide layer, and an anti-reflection layer.

The obtained material layer pattern may be a hole-type pattern.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
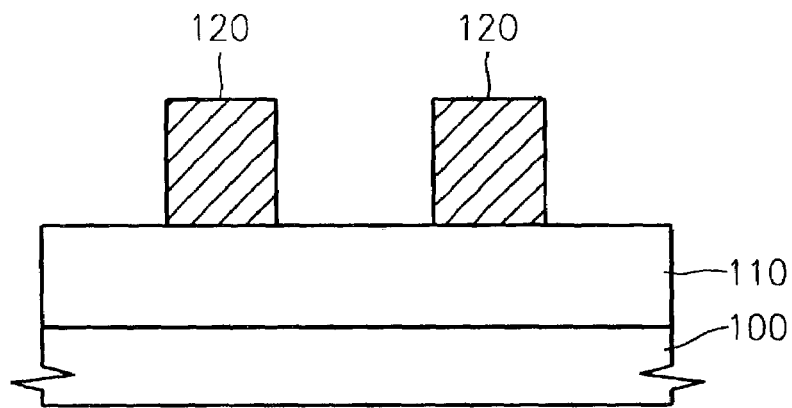
FIGS. 1A through 1D are cross-sectional views illustrating a method of forming a fine pattern according to an embodiment of the present invention.

In the drawings, the thickness of layers and regions are exaggerated for clarity. It will also be understood that when a layer is referred to as being "on" another layer or substrate, it can be directly on the other layer or substrate, or intervening layers may also be present.

FIGS. 1A through 1D are cross-sectional views illustrating a method of fabricating a fine pattern on a lower material layer, according to an embodiment of the present invention.

Referring to FIG. 1A, a material layer 110 is formed on a substrate 100. The material layer 110 is to be etched to form a pattern in a subsequent process. The material layer 110 is one layer formed of a particular material or a multi-layered layer formed of materials of various types. For instance, the material layer 110 may be formed of an insulating material, a conductive material, or a semiconductor material such as monocrystalline silicon. Alternatively, the material layer 110 may be a layer containing an insulating material layer and a conductive material layer. The material layer 110 shown in FIGS. 1A through 1D is a single layer, but a material layer shown in FIGS. 2A through 2C is a stacked structure consisting of various types of material layers.

Next, a photoresist layer is formed to a predetermined thickness on the material layer 110 and exposure and developing processes are performed. As a result, a photoresist pattern 120 having a particular pattern can be obtained as shown in FIG. 1A. In this embodiment of the present invention, the material used for the photoresist layer and the shape of the photoresist pattern 120 are not limited. That is, the photoresist pattern 120 may be a line-type pattern for forming a conductive line, such as a bit line, a word line, and a wiring line, or a hole-type pattern for forming a contact hole.

Figure 1B:
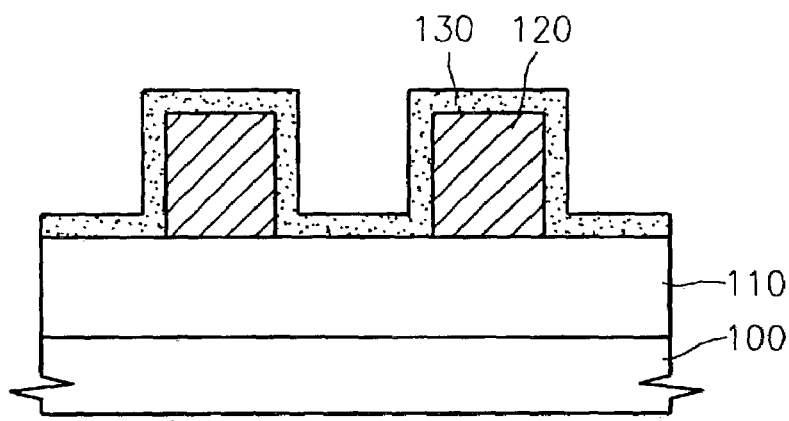
Figure 2A:
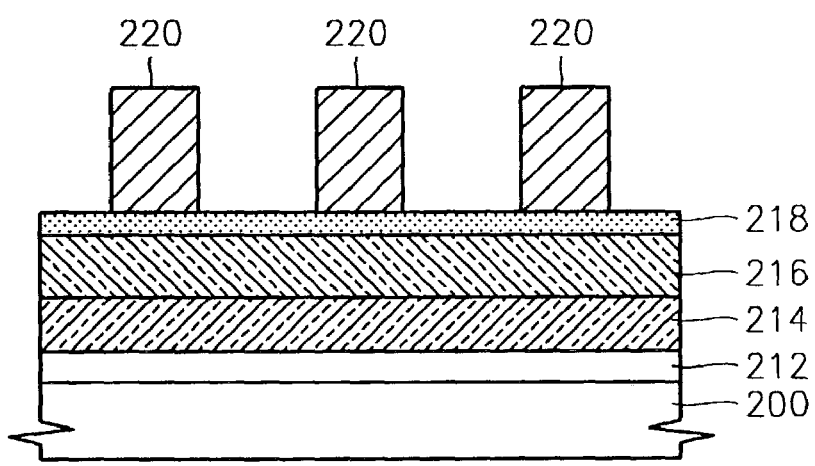
FIGS. 2A and 2B are cross-sectional views illustrating a method of forming a fine pattern of a line type using a silicon oxide layer according to another embodiment of the present invention.
Figure 2B:
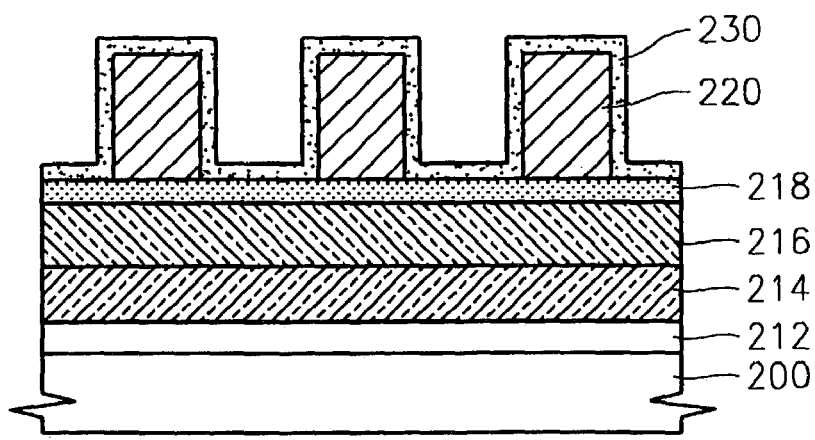
Figure 2C:
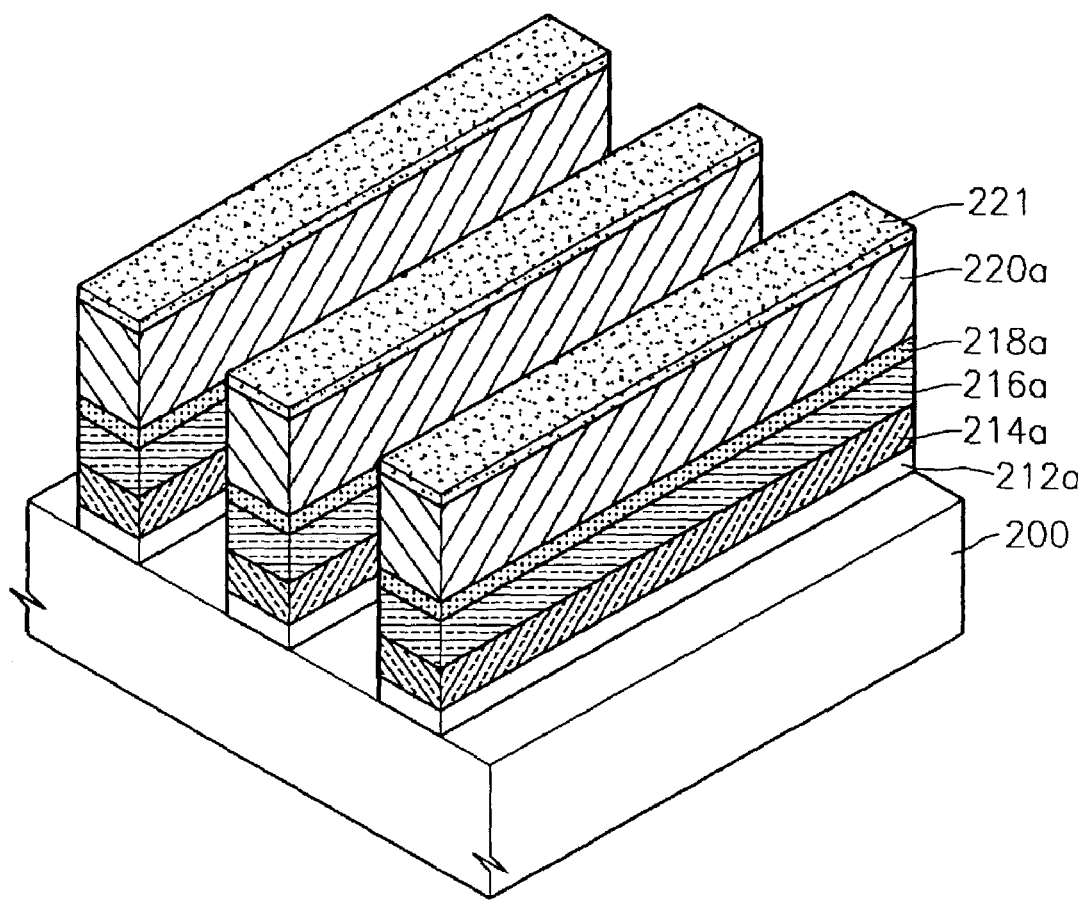
FIG. 2C is a perspective view illustrating a method of forming a fine pattern of a line type using a silicon oxide layer according to another embodiment of the present invention.

Referring to FIG. 1B, a silicon oxide layer 130 is formed on the material layer 110 and the photoresist pattern 120. According to the present invention, when the silicon oxide layer 130 is formed on the photoresist pattern 120, much attention should be paid to the following conditions. First, a change in the structure or physical properties of the photoresist pattern 120 must be avoided when forming the silicon oxide layer 130 to cover the photoresist pattern 120. That is, the photoresist pattern 120 must not be physically or chemically damaged by a chemical agent, plasma, or heat. Second, the silicon oxide layer 130 should be conformally deposited on the photoresist pattern 120 as well as on the material layer 110. If possible, it is recommended that the silicon oxide layer 130 be formed only on the photoresist pattern 120. Unless conformally deposited, the etching profile may be worsened because etch rate depends on the thickness of the silicon oxide layer 130. Third, the thickness of the silicon oxide layer 130 must be easily controlled to a desired level. In the case of a fine pattern, the thickness of the fine pattern must be minutely controlled on an Angstrom-by-Angstrom basis.

In general, atomic layer deposition (ALD) is preferred as a deposition process because it satisfies all of the above conditions. ALD is advantageous in that it can be performed at a low temperature, has better step coverage characteristics, and hardly causes a loading effect. Also, an atomic layer is obtained by piling a plurality of atomic layers in many folds using the ALD, thereby enabling the thickness of the entire atomic layer to be precisely controlled. Accordingly, it is possible to form a conformal silicon oxide layer to a desired thickness using ALD without damaging the photoresist pattern 120. However, the present invention is not restricted to this description. Thus, the silicon oxide layer 130 can be obtained using any deposition method that satisfies the above conditions.

In this embodiment, preferably, the silicon oxide layer 130 is formed at a temperature between room temperature and less than 400° C. and formed to a thickness of about 200 Å or less. The thickness of the silicon oxide layer 130 is determined in consideration of a distance between the silicon oxide layer 130 and the photoresist patterns 120, and a distance between material layer patterns 110a to be formed.

Figure 1C:
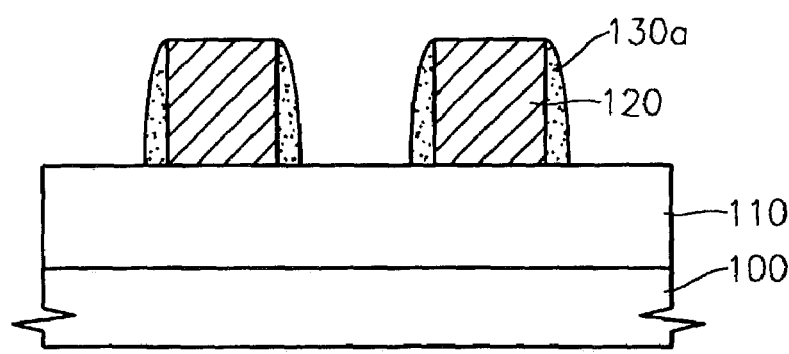
Figure 1D:
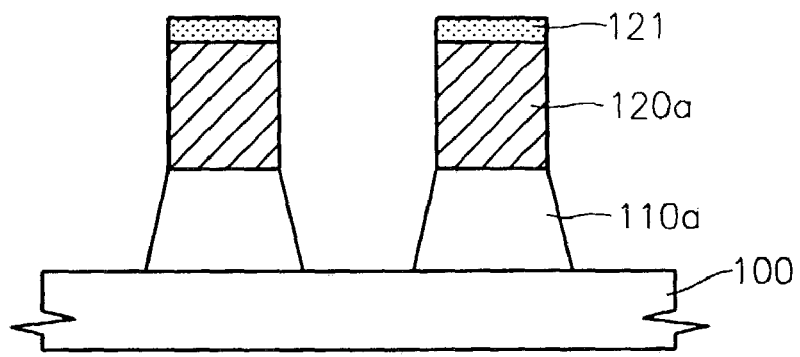

After the formation of the silicon oxide layer 130, dry etching is performed on the resultant structure to form the material layer pattern 110a, as shown in FIGS. 1C and 1D.

Referring to FIG. 1C, spacers 130a, which are formed of silicon oxide, are formed along sidewalls of the photoresist pattern 120 early in the dry etching of the material layer 110. In this case, the process condition is initially adjusted such that the etch rate of the silicon oxide layer 130 is higher than that of the photoresist pattern 120. During the etching process, the material layer 110 may be etched to a lesser degree.

The spacers 130a prevent a reduction in the width of the photoresist pattern 120 during the dry etching of the material layer 110. That is, the spacers 130a prevent atoms or plasma ions from colliding against the sidewalls of the photoresist pattern 120, thereby enabling the width of the photoresist pattern 120 to be maintained. Further, the spacers 130a helps a polymer, which is generated due to damage to the photoresist pattern 120, be accumulated on the photoresist pattern 120, as shown in FIG. 1D.

Referring to FIG. 1D, dry etching is continued to form the material layer pattern 110a. Unlike when dry etching the material layer 110, the process condition may be controlled early in the dry etching process of forming the material layer pattern 110a so that the etch rate of the photoresist pattern 120 is higher than that of the silicon oxide layer 130. As a result, during the formation of the material layer pattern 110a, the etch rate of the spacers 130a is reduced whereas the etch rate of the photoresist pattern 120 is increased, thereby damaging photoresist patterns 120a.

During this process, the damaged photoresist pattern 120a reacts with an etching gas, and as a result, a polymer, which is an organic material, is generated. For instance, the generated polymer may be a material containing carbon (C) and fluorine (F). As mentioned above, since the sidewalls of the photoresist pattern 120a are covered with the spacers 130a, the polymer is accumulated only onto the upper surfaces of the photoresist pattern 120a and becomes a polymer layer 121. The polymer layer 121 prevents the photoresist pattern 120a below the polymer layer 121 from being further damaged. If damage to the photoresist pattern 120a is prevented, thinning of the material layer pattern 110a or the occurrence of striation or wiggling on the material layer pattern 110a can be prevented.

Referring to FIG. 1D, the material layer patterns 110a are formed after the dry etching process. In the drawings, the material layer patterns 110a are illustrated to be formed by etching the material layer 110 to the full depth of the material layer 110, but there is no limit to the depth of the material layer pattern 110a. That is, if the material layer 110 is a single layer, the material layer pattern 110a may be formed by etching the material layer 110 to the full depth or to a desired depth on the substrate 100. If the material layer 110 is a stacked structure consisting of layers of various types, the material layer pattern 110a may also be formed by etching the material layer 110 to the full depth or to a desired depth.

After completing the dry etching, the spacers 130a, which are formed of a thin silicon oxide layer, are completely removed.

Figure 3:
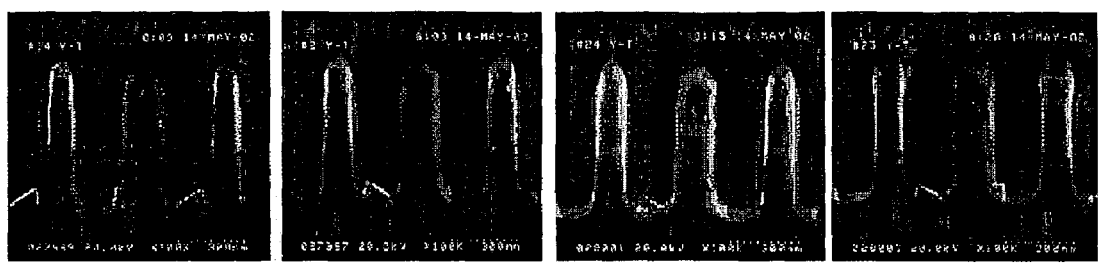
FIG. 3 contains images of the semiconductor device of FIG. 2C, taken by a scanning electron microscope (SEM), in which a first image shows a fine pattern obtained without forming a first silicon oxide layer, and the other images each show a fine pattern obtained by forming the first silicon oxide layer to a thickness of 10 Å, 50 Å, and 100 Å, respectively.

FIGS. 2A through 2C are cross-sectional views and a perspective view illustrating a method of forming a line-type pattern, according to another embodiment of the present invention. FIG. 3 contains images of the semiconductor device of FIG. 2C, taken by a scanning electron microscope (SEM). In detail, in FIG. 3, the first image shows the profile of a fine pattern, i.e., the resultant structure of FIG. 2A, obtained without forming a first silicon oxide layer 230 of FIG. 2B and then performing an etching process on the resultant structure. Each of the second through fourth images shows the profile of a fine pattern, i.e., the resultant structure of FIG. 2B, obtained by forming the first silicon oxide layer 230 and then performing etching process on the resultant structure. In detail, in the second through fourth images, the first silicon oxide layer 230 is formed to a thickness of 10 Å, 50 Å, and 100 Å, respectively.

Referring to FIGS. 2A through 2C, a stacked structure including a second silicon oxide layer 212, a polysilicon layer 214, a metal silicide layer 216, and an anti-reflection layer 218 is formed on a substrate 200. The stacked structure may be used in forming a pattern of a line type, such as a bit line or a word line.

In this embodiment, the second silicon oxide layer 212 and the polysilicon layer 214 are formed to a thickness of about 1200 Å and about 1150 Å, respectively. Also, the metal silicide layer 216 is formed of tungsten silicide (WSi) to a thickness of about 1500 Å, and the anti-reflection layer 218 is formed to a thickness of about 240 Å. Next, a photoresist pattern 220 is formed on the anti-reflection layer 218, and the first silicon oxide layer 230 is formed using ALD to cover the anti-reflection layer 218 and the photoresist pattern 220. Thereafter, dry etching is performed on the resultant structure.

FIG. 3 illustrates that an increase in the thickness of the first silicon oxide layer 230 results in an improvement in the profile of a fine pattern. That is, the profile of the pattern is more clearly presented when the first silicon oxide layer 230 exists than when the first silicon oxide layer 230 does not exist. When the first silicon oxide layer 230 is thickly formed to a thickness of about 100 Å, the profile of the obtained pattern is almost the same as that of a desired pattern.

However, in order to obtain a desired pattern by etching a certain material layer, other conditions, such as the size of the desired pattern and the distance between adjacent patterns, must be also considered during an etching process. This is because the thickness of the first silicon oxide layer 230 depends on the size of the desired pattern and the distance between adjacent patterns.

Figure 4:
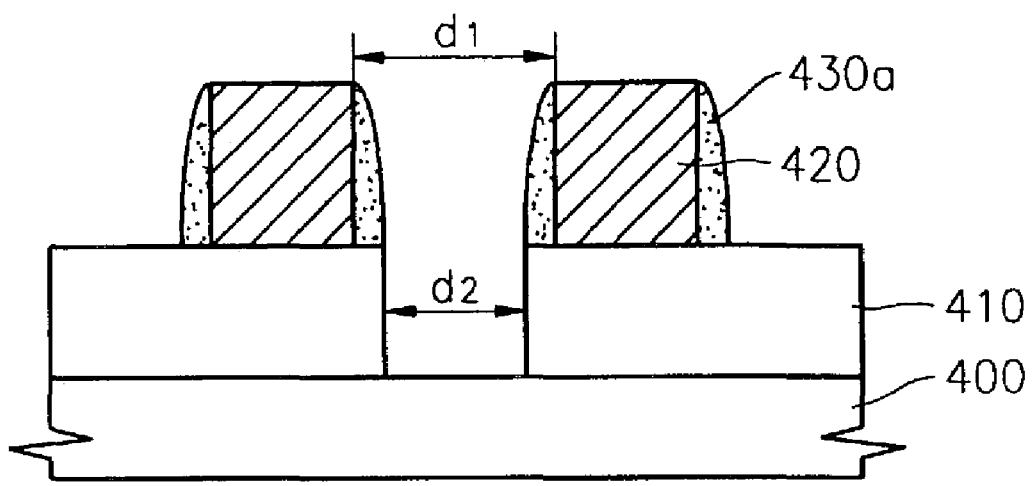
FIG. 4 is a cross-sectional view illustrating a method of forming a fine pattern of a hole-type according to yet another embodiment of the present invention.

FIG. 4 is a schematic cross-sectional view illustrating a method of forming a hole-type pattern, according to yet another embodiment of the present invention. In this case, the processes adopted in the aforementioned embodiments are used.

In this embodiment, a hole-type pattern can also be formed without damaging photoresist patterns 420. Also, according to this embodiment, an ultra-fine pattern of a hole-type can be formed to be smaller than a distance between the photoresist patterns 420.

FIG. 4 corresponds to FIG. 1C. Referring to FIG. 4, a material layer 410, in which a hole is to be formed, is formed on a substrate 400, and the photoresist patterns 420 are formed on the material layer 410. Also, spacers 430a, which are silicon oxide layers, are formed along the sidewalls of the photoresist patterns 420. In this embodiment, the spacers 430a, i.e., silicon oxide layers, are thickly formed along the sidewalls of the photoresist patterns 420 so that the spacers 430a can remain along the sidewalls of the photoresist patterns 420 even after an etching process is performed. Accordingly, the size $d_2$ of the hole becomes narrower than a distance $d_1$ between the photoresist patterns 430a.

As described above, in a method of forming a fine pattern according to the present invention, a silicon oxide layer is formed on a photoresist pattern, and thus, it is possible to prevent the photoresist pattern from being damaged when dry etching is performed in a subsequent process. Therefore, a fine pattern can be formed to have a desired pattern profile, and further, it is possible to prevent the thinning of a patterned lower layer and the occurrence of striation or wiggling on the lower layer. In addition, a hole-type pattern may be formed to be narrower than the distance between photoresist patterns.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming a fine pattern by etching a material layer formed on a semiconductor substrate, the method comprising:

forming a photoresist layer on the material layer;

forming a photoresist pattern by performing exposure and developing processes on the photoresist layer;

forming a first silicon oxide layer conformally on the material layer and the photoresist pattern without damaging the photoresist pattern;

forming a material layer pattern by dry etching the first silicon oxide layer and the material layer; and forming a polymer layer on an upper surface of the photoresist pattern for preventing damage to the photoresist pattern.

2. The method of claim 1, wherein the first silicon oxide layer is formed at a temperature between room temperature and 400° C.

3. The method of claim 1, wherein the first silicon oxide layer is formed to a thickness of less than 200 Å.

4. The method of claim 3, wherein the first silicon oxide layer is formed using atomic layer deposition (ALD).

5. The method of claim 1, wherein the material layer pattern is a line-type pattern.

6. The method of claim 5, wherein the material layer pattern is one of a bit line pattern and a word line pattern.

7. The method of claim 6, wherein the material layer is a stacked structure including a second silicon oxide layer, a polysilicon layer, a metal silicide layer, and an anti-reflection layer.

8. The method of claim 1, wherein the material layer pattern is a hole-type pattern.

9. The method of claim 1, wherein the material layer pattern is a hole-type pattern.

10. A method of forming a fine pattern by etching a material layer formed on a semiconductor substrate, the method comprising:
   forming a photoresist layer on the material layer;
   forming a photoresist pattern by performing exposure and developing processes on the photoresist layer;
   forming a first silicon oxide layer conformally on the material layer and the photoresist pattern without damaging the photoresist pattern;
   performing a first dry etching on the material layer under a process condition in which the etch rate of the first silicon oxide layer is higher than that of the photoresist pattern;
   forming a material layer pattern by performing a second dry etching on the material layer under a process condition in which the etch rate of the first silicon oxide layer is lower than that of the photoresist pattern; and
   forming a polymer layer on an upper surface of the photoresist pattern during the second dry etching for preventing damage to the photoresist pattern.

11. The method of claim 10, wherein the first silicon oxide layer is formed at a temperature between room temperature and 400° C.

12. The method of claim 10, wherein the first silicon oxide layer is formed to a thickness of less than 200 Å.

13. The method of claim 12, wherein the first silicon oxide layer is formed using ALD.

14. The method of claim 10, wherein performing the first dry etching comprises forming spacers along the sidewalls of the photoresist patterns.

15. The method of claim 10, wherein the material layer pattern is a line-type pattern.

16. The method of claim 15, wherein the material layer pattern is one of a bit line pattern and a word line pattern.

17. The method of claim 16, wherein the material layer is a stacked structure including a second silicon oxide layer, a polysilicon layer, a metal silicide layer, and an anti-reflection layer.

* * * * *